US008786295B2

(12) United States Patent
Chandra et al.

(10) Patent No.: US 8,786,295 B2
(45) Date of Patent: Jul. 22, 2014

(54) CURRENT SENSING APPARATUS AND METHOD FOR A CAPACITANCE-SENSING DEVICE

(75) Inventors: Lokesh Chandra, New Delhi (IN); Edward Grivna, Brooklyn Park, MN (US)

(73) Assignee: Cypress Semiconductor Corporation, San Jose, CA (US)

( * ) Notice: Subject to any disclaimer, the term of this patent is extended or adjusted under 35 U.S.C. 154(b) by 556 days.

(21) Appl. No.: 13/091,067

(22) Filed: Apr. 20, 2011

(65) Prior Publication Data

US 2012/0268145 A1 Oct. 25, 2012

(51) Int. Cl.
*G01R 27/26* (2006.01)
*G06F 3/044* (2006.01)
*G06F 3/041* (2006.01)

(52) U.S. Cl.
CPC .... *G06F 3/044* (2013.01); *H03K 2217/960735* (2013.01); *G06F 3/0416* (2013.01)
USPC .................... 324/686; 324/76.66; 324/750.17

(58) Field of Classification Search
USPC ......... 324/672–688, 600, 548, 658, 661, 427, 324/382, 519, 500, 750.17, 754.28
See application file for complete search history.

(56) References Cited

U.S. PATENT DOCUMENTS

| | | | | |
|---|---|---|---|---|
| 6,353,324 | B1 * | 3/2002 | Uber et al. | 324/457 |
| 8,093,914 | B2 * | 1/2012 | Maharyta et al. | 324/684 |
| 8,112,240 | B2 * | 2/2012 | Fennell | 702/117 |
| 2009/0045821 | A1 | 2/2009 | Liao et al. | |
| 2009/0153152 | A1 * | 6/2009 | Maharyta et al. | 324/684 |
| 2011/0050255 | A1 | 3/2011 | Iriarte et al. | |
| 2011/0063154 | A1 | 3/2011 | Hotelling et al. | |

OTHER PUBLICATIONS

International Search Report for International Application No. PCT/US11/66684 dated May 4, 2012; 2 pages.

Written Opinion of the International Searching Authority for International Application No. PCT/US11/66684 dated May 4, 2012; 6 pages.

* cited by examiner

*Primary Examiner* — Melissa Koval
*Assistant Examiner* — Trung Nguyen
(74) *Attorney, Agent, or Firm* — Lowenstein Sandler LLP

(57) ABSTRACT

A capacitance-sensing device including a current-to-voltage converter and an analog-to-digital converter is described. A sense element is coupled to an input of the current-to-voltage converter. The current-to-voltage converter is configured to convert current changes in the coupled sense element to an output voltage and to maintain a constant voltage at the input. The analog-to-digital converter is configured to convert the output voltage generated by the current-to-voltage converter to a digital value.

17 Claims, 8 Drawing Sheets

Processing device 210
Analog Bus 301
Analog Multiplexor Bus 390
SENSE Array 310
355(1)
301(1)
Capacitance-Sensing Circuitry 201
301(N)
355(N)
Analog Multiplexor 330
CAP 351(1)
CAP 351(N)

CURRENT SENSING APPARATUS AND METHOD FOR A CAPACITANCE-SENSING DEVICE

TECHNICAL FIELD

Embodiments of the present invention relate to the field of user interface devices and, in particular, to touch-sensing devices.

BACKGROUND

Computing devices, such as notebook computers, personal data assistants (PDAs), and mobile handsets, have user interface devices, which are also known as human interface devices (HID). One type of user interface devices that has become more common is touch-sensing devices, such as touch-sensor pads (also commonly referred to as touchpads), touch-sensor sliders, touch-sensor buttons, touch-sensor keyboard, touchsreens, and touchpanels. There are a number of types of touch sensing technology, such as optical imaging, resistive, surface wave, capacitive, infrared, dispersive signal, and strain gauge technologies.

In general, capacitance-sensing devices may replace mechanical buttons, knobs, and other similar mechanical user interface controls. Capacitance-sensing devices eliminate the complicated mechanical switches and buttons, providing reliable operation under harsh conditions. In addition, capacitance-sensing devices are widely used in modern customer applications, providing new user interface options in existing products.

A typical capacitance-sensing device includes one or more sense elements that form a touch-sensing surface and capacitance-sensing circuitry configured to measure the capacitance on the one or more sense elements. The sense elements of the capacitance-sensing devices can be arranged in the form of an array for the touch-sensing surface. When a touch object, such as a finger, comes in close proximity or physical contact with the touch-sensing surface, capacitance-sensing circuitry measures capacitances on the one or more sense elements of the touch-sensing surface. The capacitance-sensing circuitry also measures the capacitances when the touch object is not in proximity or in contact to establish baseline or reference level of capacitance. The measured capacitance(s) can be converted into digital values, and the digital values can be used, for example, to detect a presence of a touch object, measure distance, speed, and acceleration of the touch object on the touch-sensing surface, as well as detecting gestures of the touch object.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format in order to avoid unnecessarily obscuring the present invention. Thus, the specific details set forth are merely exemplary. Particular implementations may vary from these exemplary details and still be contemplated to be within the spirit and scope of the present disclosure.

References in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Embodiments of a method and an apparatus are described for a capacitance-sensing device. In one embodiment, an apparatus includes a current-to-voltage converter coupled to receive a current representing a capacitance of a sense element, and an analog-to-digital converter (ADC) coupled to the current-to-voltage converter. The current-to-voltage converter is configured to convert the current to an output voltage, and the ADC is configured to receive the output voltage and convert the output voltage to a digital value. The current-to-voltage converter is configured to maintain an approximately constant voltage at the input of the current-to-voltage converter.

Figure 1:
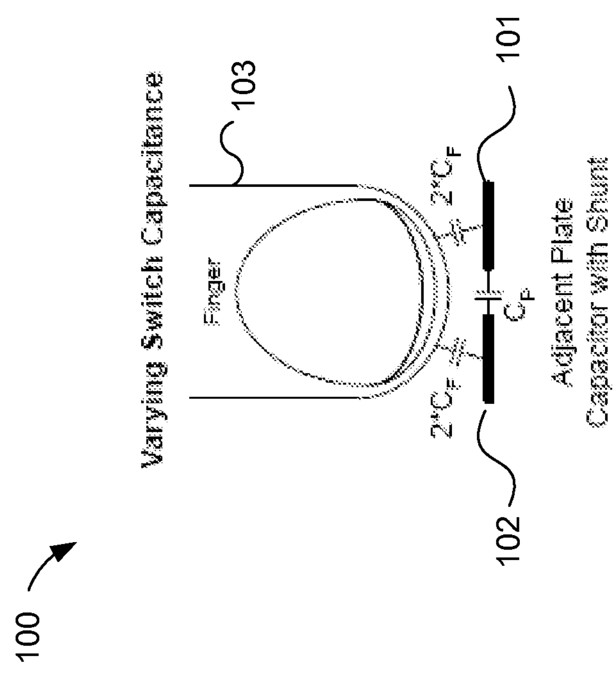
FIG. 1 illustrates a varying switch capacitance.
Figure 3:
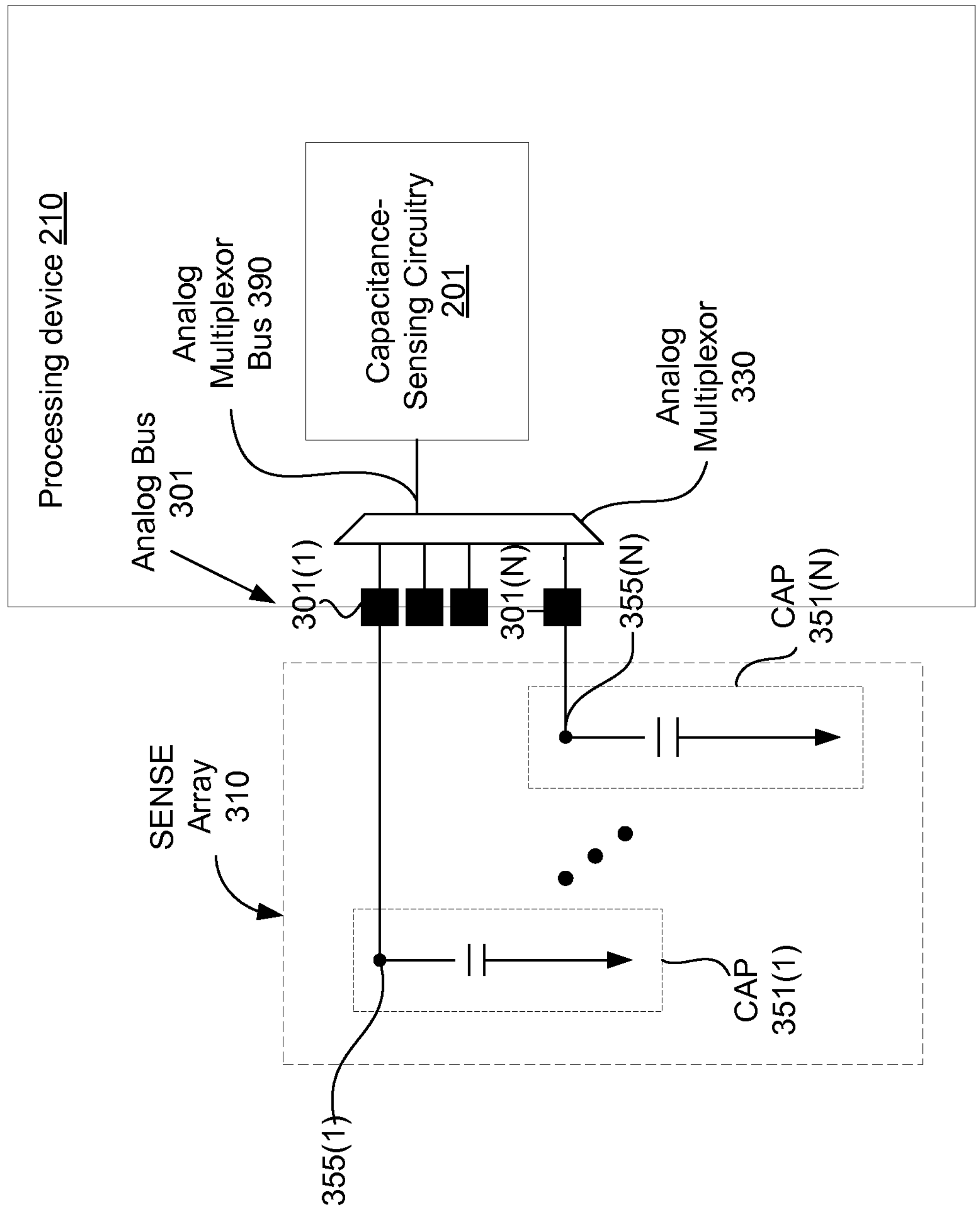
FIG. 3 illustrates a block diagram of one embodiment of the processing device including capacitance-sensing circuitry.

FIG. 1 illustrates a varying switch capacitance. In its basic form, a capacitive switch 100 is a pair of adjacent electrodes 101 and 102. There is a small edge-to-edge capacitance $C_P$, but the intent of switch layout is to minimize the base capacitance $C_P$ between these electrodes. When a touch object 103 (e.g., finger, conductive object) is placed in proximity to the electrodes 101 and 102, there is a capacitance $2*C_F$ between one electrode 101 and the touch object 103 and a similar capacitance $2*C_F$ between the touch object 103 and the other electrode 102. The capacitance between one electrode 101 and the touch object 103 and back to the other electrode 102 adds in parallel to the base capacitance $C_P$ between the electrodes 101 and 102, resulting in a change of capacitance $C_F$. Capacitive switch 100 may be used in a capacitive switch array. The capacitive switch array is a set of capacitors where one side of each is grounded. Thus, the active capacitor (as represented in FIG. 3 as capacitor 351) has only one accessible side. The presence of the touch object 103 increases the capacitance ($C_P+C_F$) of the capacitive switch 100 to ground. The presence of a touch object is detected when the value of the measured capacitance reaches a touch threshold value. Determining switch activation is then a matter of measuring change in the capacitance ($C_F$) or capacitance variation. Switch 100 is also known as a grounded variable capacitor. In one exemplary embodiment, $C_F$ may range from approximately 10-30 picofarads (pF). Alternatively, other ranges may be used.

The touch object in this case is a finger, alternatively, this technique may be applied to any conductive object, for example, a conductive door switch, position sensor, or conductive pen in a stylus tracking system (e.g., stylus) or other types of touch objects.

Because of the physical structure of the sense element, the signal ground associated with the baseline capacitance $C_P$ may be different (and noisier) from the ground associated with the finger capacitance $C_F$. As described below, the capacitance-sensing circuitry receives a current representing the capacitance of the sense element, and the current-to-voltage converter converts the current to an output voltage, which is measured by the ADC. Thus, the voltage measured by the processing device may be modulated by the noise affecting the measured value of the finger capacitance $C_F$. This results in noise being present in the values measured by the processing device.

Figure 2:
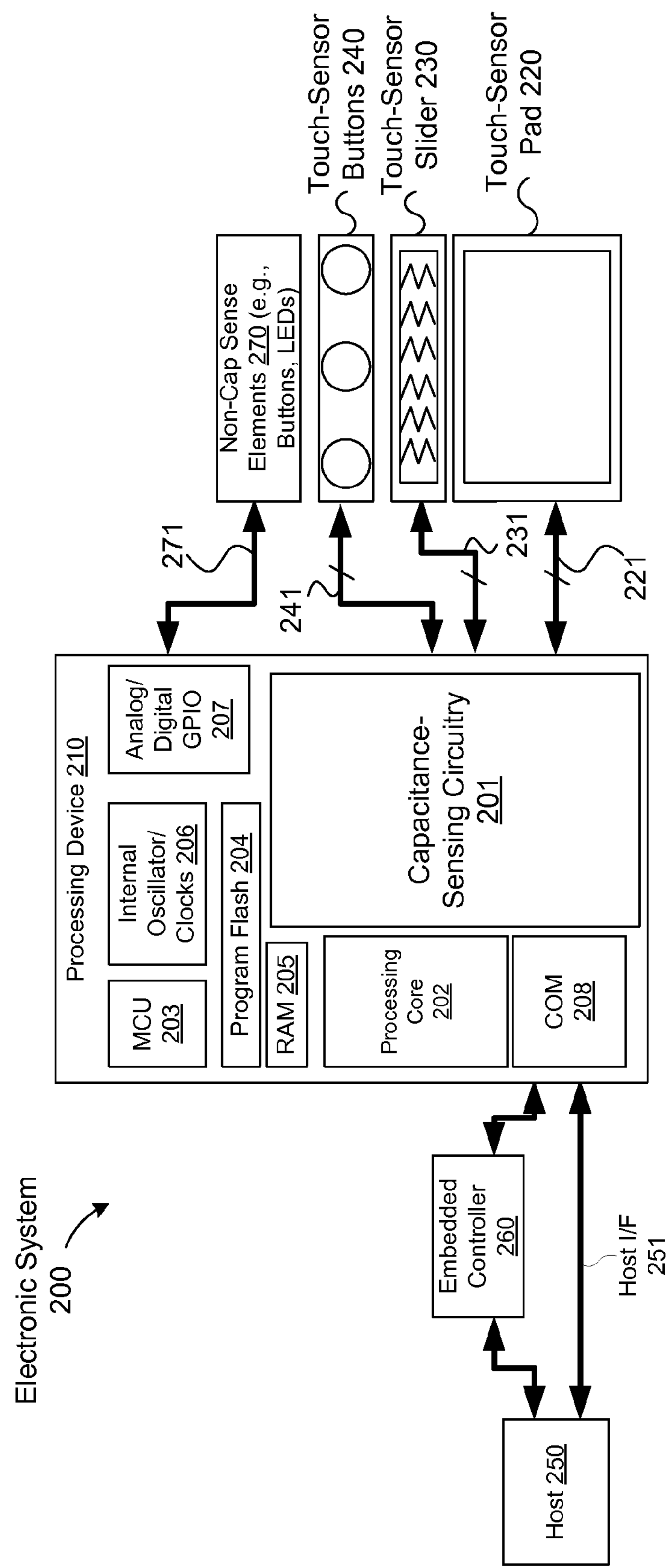
FIG. 2 illustrates a block diagram of one embodiment of an electronic system having a processing device for capacitance sensing.

FIG. 2 illustrates a block diagram of one embodiment of an electronic system having a processing device for capacitance sensing. Electronic system 200 includes processing device 210, which includes capacitance-sensing circuitry 201, touch-sensor pad 220, touch-sensor slider 230, touch-sensor buttons 240, host processor 250, embedded controller 260, and non-capacitive sense elements 270. The processing device 210 may include analog and/or digital general purpose input/output ("GPIO") ports 207. GPIO ports 207 may be programmable. GPIO ports 207 may be coupled to a Programmable Interconnect and Logic ("PIL"), which acts as an interconnection between GPIO ports 207 and a digital block array of the processing device 210 (not illustrated). The digital block array may be configured to implement a variety of digital logic circuits (e.g., DAC, digital filters, digital control systems) using, in one embodiment, configurable user modules ("UMs"). The digital block array may be coupled to a system bus. Processing device 210 may also include memory, such as random access memory (RAM) 205 and program flash 204. RAM 205 may be static RAM (SRAM), and program flash 204 may be a non-volatile storage, which may be used to store firmware (e.g., control algorithms executable by processing core 202 to implement operations described herein). Processing device 210 may also include a memory controller unit (MCU) 203 coupled to memory and the processing core 202.

The processing device 210 may also include an analog block array (not illustrated). The analog block array may also be coupled to the system bus. The analog block array also may be configured to implement a variety of analog circuits (e.g., ADC, gain amplifier, linear buffer, analog filters) using configurable UMs. The analog block array may also be coupled to the GPIO 207.

As illustrated, capacitance-sensing circuitry 201 may be integrated into processing device 210. Capacitance-sensing circuitry 201 may include analog I/O for coupling to an external component, such as touch-sensor pad 220, touch-sensor slider 230, touch-sensor buttons 240, and/or other devices. Capacitance-sensing circuitry 201 and processing device 210 are described in more detail below with respect to FIGS. 3-4C, and a method for capacitance sensing is described below with respect to FIG. 5.

In one embodiment, the electronic system 200 includes a touch-sensor pad 220 coupled to the processing device 210 via bus 221. Touch-sensor pad 220 may include a multi-dimension sense array. The multi-dimension sense array includes multiple sense elements, organized as rows and columns. In another embodiment, the electronic system 200 includes a touch-sensor slider 230 coupled to the processing device 210 via bus 231. Touch-sensor slider 230 may include a single-dimension sense array. The single-dimension sense array includes multiple sense elements, organized as rows, or alternatively, as columns. In another embodiment, the electronic system 200 includes one or more touch-sensor buttons 240 coupled to the processing device 210 via bus 241. Touch-sensor buttons 240 may include a single-dimension or multi-dimension sense array. The single or multi-dimension sense array includes multiple sense elements. For a touch-sensor button, the sense elements of the sense array may be coupled together to detect a presence of a touch object in proximity to or in contact with the surface of the sensing device. Capacitive sense elements may be used as non-contact switches. These switches, when protected by an insulating layer, offer resistance to severe environments.

The electronic system 200 may include any combination of one or more of the touch-sensor pad 220, touch-sensor slider 230, and/or touch-sensor buttons 240. In another embodiment, the electronic system 200 may also include non-capacitive sense elements 270 coupled to the processing device 210 via bus 271. The non-capacitive sense elements 270 may include buttons, light emitting diodes (LEDs), and other user interface devices, such as a mouse, a keyboard, or other functional keys that do not require capacitance sensing. In one embodiment, buses 271, 241, 231, and 221 may be a single bus. Alternatively, these buses may be configured into any combination of one or more separate buses.

The processing device 210 may also provide value-add functionality such as keyboard control integration, LED drivers, battery charger and general purpose I/O, as illustrated as supporting non-capacitive sense elements 270. Non-capacitive sense elements 270 are coupled to the GPIO 207.

Processing device 210 may include internal oscillator/clocks 206, and communication block 208. The oscillator/clocks block 206 provides clock signals to one or more of the components of processing device 210. Communication block 208 may be used to communicate with an external component, such as a host processor 250, via host interface (I/F) line 251. Alternatively, processing device 210 may also be coupled to embedded controller 260 to communicate with the external components, such as host 250. Interfacing to the host 250 can be through various methods. In one exemplary embodiment, interfacing with the host 250 may be done using a standard I2C (Inter IC Communications) interface to connect to an embedded controller 260, which in turn sends data to the host 250 via a low pin count (LPC) interface. In some instances, it may be beneficial for the processing device 210 to do both touchpad and keyboard control operations, thereby freeing up the embedded controller 260 for other data processing functions. In another exemplary embodiment, interfacing may be done using a universal serial bus (USB) interface directly coupled to the host 250 via host interface line 251. Alternatively, the processing device 210 may communicate to external components, such as the host 250 using industry standard interfaces, such as USB, PS/2, inter-integrated circuit (I2C) bus, or serial peripheral interface (SPI). The host 250 and/or embedded controller 260 may be coupled to the processing device 210 with a ribbon or flex cable, from an assembly, which houses the touch-sensor pad and processing device.

In one embodiment, the processing device 210 is configured to communicate with the embedded controller 260 or the host 250 to send data. The data may be a command or alternatively a signal. In an exemplary embodiment, the electronic system 200 may be configured to emulate a computer mouse for purposes of cursor movement and control, and operate in both standard-mouse compatible and enhanced modes. The standard-mouse compatible mode may utilize the HID class drivers already built into the Operating System (OS) software of host 250. These drivers enable the processing device 210 and sensing device to operate as a standard cursor control user interface device, such as a two-button mouse. The enhanced mode may enable additional features such as scrolling or disabling the capacitance-sensing device, such as when a mouse is plugged into the host computer. Alternatively, the processing device 210 may be configured to communicate with the embedded controller 260 or the host 250, using non-OS drivers, such as dedicated touch-sensor pad drivers, or other drivers known by those of ordinary skill in the art.

In other words, the processing device 210 may operate to communicate data (e.g., commands or signals) using hardware, software, and/or firmware, and the data may be communicated directly to the processing device of the host 250, such as a host processor, or alternatively, may be communicated to the host 250 via drivers of the host 250, such as OS drivers, or other non-OS drivers. It should also be noted that the host 250 may directly communicate with the processing device 210 via host interface line 251.

In one embodiment, the data sent to the host 250 from the processing device 210 may include click, double-click, movement of the cursor, scroll-up, scroll-down, scroll-left, scroll-right, step Back, and step Forward. Alternatively, other user interface device commands may be communicated to the host 250 from the processing device 210. These commands may be based on gestures occurring on the sensing device that are recognized by the processing device, such as tap, push, hop, and zigzag gestures. Alternatively, other commands or gestures may be recognized and reported. Similarly, signals may be sent that indicate the recognition of these operations. In an alternate embodiment only the measured capacitance values may be communicated to host 250, with gestures being recognized and implemented by that device. In another embodiment, the processing device 210 performs system level functions too, such that there is no need to communicate with an external host.

Processing device 210 may reside on a common carrier substrate such as, for example, an integrated circuit (IC) die substrate, a multi-chip module substrate, or the like. Alternatively, the components of processing device 210 may be one or more separate integrated circuits and/or discrete components. In one embodiment, the processing device 210 is the PSoC® processing device offered by Cypress Semiconductor Corporation (San Jose, Calif.), such as described with respect to FIG. 6. Alternatively, the processing device 210 may be other types of processing devices as would be appreciated by those of ordinary skill in the art having the benefit of this disclosure, such as microprocessors or central processing units, controllers, special-purpose processors, digital signal processors (DSPs), application specific integrated circuits (ASICs), field programmable gate arrays (FPGAs), or the like. In an alternative embodiment, for example, the processing device may be a network processor having multiple processors including a core unit and multiple microengines. Additionally, the processing device may include any combination of general-purpose processing device(s) and special-purpose processing device(s).

Capacitance-sensing circuitry 201 may be integrated into the same IC as the processing device 210, or alternatively, in a separate IC. Alternatively, descriptions of capacitance-sensing circuitry 201 may be generated and compiled for incorporation into other integrated circuits. For example, behavioral level code describing capacitance-sensing circuitry 201, or portions thereof, may be generated using a hardware description language, such as VHDL or Verilog, and stored to a machine-accessible medium (e.g., CD-ROM, hard disk, floppy disk). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe capacitance-sensing circuitry 201.

It should be noted that the components of electronic system 200 may include all the components described above. Alternatively, electronic system 200 may include only some of the components described above.

In one embodiment, electronic system 200 may be used in a notebook computer. Alternatively, the electronic device may be used in other applications, such as a mobile handset, a personal data assistant (PDA), e-book reader, a keyboard, a television, a remote control, a monitor, a handheld multimedia device, a handheld video player, a handheld gaming device, or a control panel.

FIG. 3 illustrates a block diagram of one embodiment of a processing device 210 including a capacitance-sensing circuitry 201. Capacitance-sensing circuitry 201 is coupled to analog multiplexor 330, which is coupled to a sense array 310, via an analog multiplexor bus 390. Sense array 310 includes multiple sense elements 355(1)-355(N), where N is a positive integer value that represents the number of rows (or alternatively columns, or a mix of rows and columns) of the sense array 310. In one embodiment, each sense element is represented as a capacitor. The sense array 310 may be coupled to the capacitance-sensing circuitry 201 via an analog bus 301 having multiple pins 301(1)-301(N) using an analog multiplexor (Mux) 330.

In one embodiment, the sense array 310 may be a single-dimension sense array including the sense elements 355(1)-355(N), where N is a positive integer value that represents the number of sense elements of the single-dimension sense array. The single-dimension sense array 310 provides output signals to the analog bus 301 of the processing device 210. Alternatively, the sense array 310 may be a multi-dimension sense array including the sense elements 355(1)-355(N), where N is a positive integer value that represents the number of sense elements of the multi-dimension sense array. The multi-dimension sense array 310 provides output signals to the analog bus 301 of the processing device 210.

The capacitance-sensing circuitry 201 uses the switches present in the analog mux 330 to switch the sense elements 355 of the sense array 310 between the analog multiplexor bus 390 and ground. In this embodiment, the capacitance-sensing circuitry 201 provides a reference level other than ground to the measured sense element 355 via the analog bus 301. In one embodiment, the capacitance-sensing circuitry 201 provides the reference level using feedback on an operational amplifier. When a sense element is being measured, these switches are operated in a non-overlapping fashion to prevent a direct path between the analog multiplexor bus 390 and ground. In an alternate embodiment, the sensing may be supply (e.g., VDD) referenced and the capacitance-sensing circuitry 201 may switch the sense elements 355 between the analog bus 301 and supply. This switching charges and discharges the sense element 355 repeatedly, and forms the circuit equivalent of a resistor to ground. This charging and discharging gives rise to a current ($I_{sensor}$), which is proportional to the capacitance of the sense element 355. Thus, when the capacitance changes, the capacitance-sensing circuitry 201 can measure the corresponding change in current to determine the capacitance. In another embodiment, the capacitance-sensing circuitry 201 is coupled to the sense elements 355(1)-355(N) using other techniques as would be appreciated by one of ordinary skill in the art having the benefit of this disclosure.

The analog multiplexor 330 is coupled to the sense elements 355(1)-355(N) and the capacitance-sensing circuitry 201. The analog multiplexor 330 may be used to allow the capacitance-sensing circuitry 201 to measure capacitance on multiple sense elements (e.g., buttons, sliders, rows, or columns). The analog multiplexor 330 may be configured to sequentially select a sense element of the multiple sense elements to provide the charge current and to measure the capacitance of each sense element. In one exemplary embodiment, the analog multiplexor 330 is a switch array, which may be used to ground the sense elements that are not being measured. This may be done in conjunction with a pin in the GPIO port 207 (depicted in FIG. 2). Alternatively, the analog multiplexor 330 may be circuitry inside the capacitance-sensing circuitry 201, or a circuitry outside the capacitance-sensing circuitry 201 to select the sense element (or elements) to be measured. Processing device 210 may include one capacitance-sensing circuitry 201 for the sense elements of the sense array. Alternatively, processing device 210 may include multiple capacitance-sensing circuitries to measure capacitance on the sense elements of the sense array 310.

In another embodiment, the capacitance-sensing circuitry 201 may be configured to simultaneously measure the sense elements, as opposed to being configured to sequentially scan the sense elements as described above. For example, a sensing device may include a sense array having rows and columns. The capacitances of the row sense elements may be measured simultaneously, and the capacitances of the column sense elements may be measured simultaneously. Alternatively, other scanning techniques may be used as would be appreciated by one of ordinary skill in the art having the benefit of this disclosure.

Figure 4A:
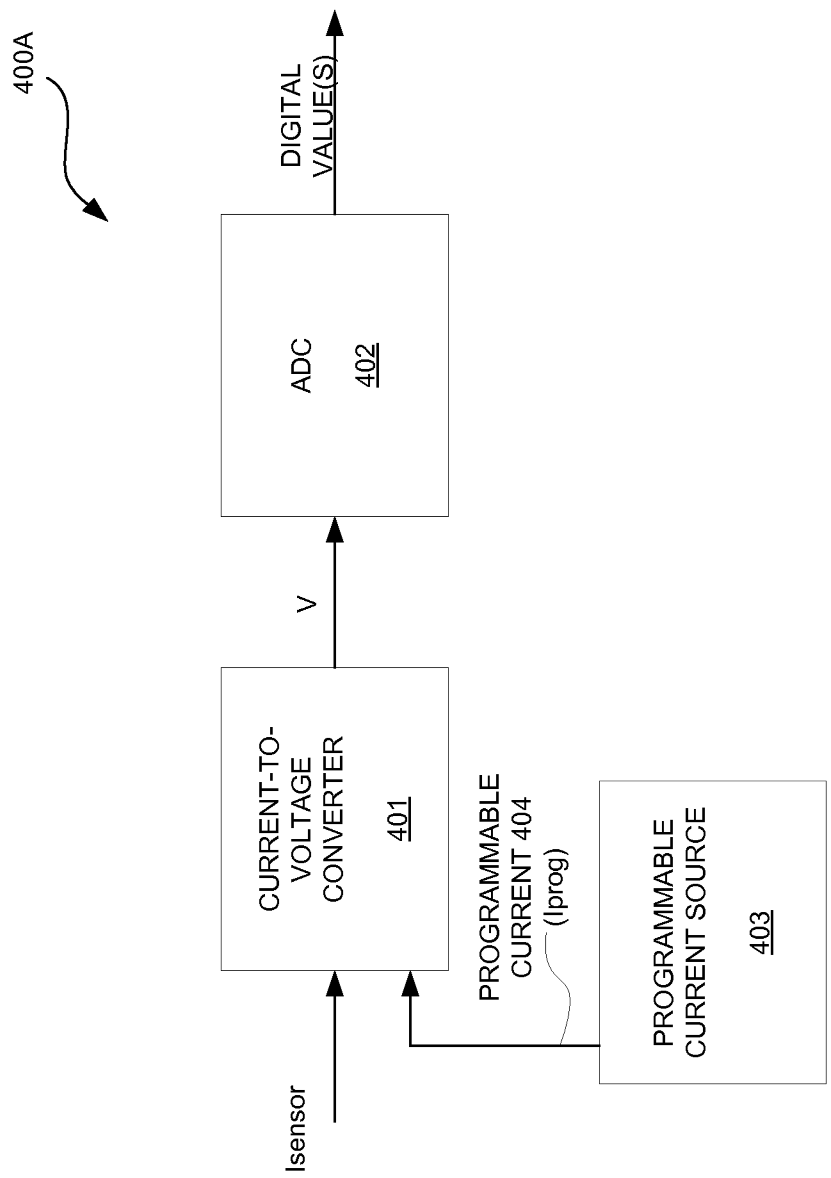
FIG. 4A illustrates a block diagram of capacitance-sensing circuitry of the processing device of FIG. 3.

FIG. 4A illustrates a block diagram of capacitance-sensing circuitry 400A of the processing device 210 of FIG. 3. The capacitance-sensing circuitry 400A includes a current-to-voltage converter 401 and an analog-to-digital converter (ADC) 402. As described above, the capacitance-sensing circuitry 400A provides a reference level other than ground to the sense element 355 via the analog bus 301, and the sense element 355 is charged and discharged, giving rise to a current ($I_{sensor}$), which is proportional to the capacitance of the sense element 355. The capacitance-sensing circuitry 400A, using the current-to-voltage converter 401, converts the current (I sensor) to an analog output voltage. The ADC 402 receives the analog output voltage from the current-to-voltage converter 401 and converts the analog output voltage to a digital output (e.g., one or more digital values). In one embodiment, the digital output is a numeric value representing the capacitance of the measured sense element to be read by, for example, the processing core of the processing device 210 or the host 250 (depicted in FIG. 2).

In the depicted embodiment, the capacitance-sensing circuitry 400A further includes a programmable current source 403 (e.g., a current digital to analog converter (IDAC)) that is configured to generate a programmable current ($I_{prog}$) 404 to cancel or offset a current drawn by the parasitic capacitance ($C_P$) of the sense element coupled to the input of the current-to-voltage converter 401. In one embodiment, the programmable current source 403 is a current digital-to-analog converter (IDAC) that produces the programmable current ($I_{prog}$). In one embodiment, the IDAC is programmed by writing a specified value into a register associated with the IDAC in order to generate the programmable current ($I_{prog}$). The IDAC current, when programmed, is a constant mixed with the variable $I_{sensor}$ current, and is used to change the offset or baseline of the current-to-voltage converter 401, to keep this output within the linear operating range of the ADC 402. In one embodiment, the current-to-voltage converter 401 is a transimpedance amplifier (TIA) having an operational amplifier with a negative feedback. In this embodiment, a sense element (e.g., the selected sense element being measured by the capacitance-sensing circuitry 400A) is coupled to a negative input of the operational amplifier and the current-to-voltage converter 401 converts the sensor current ($I_{sensor}$) provided to the sense element to a voltage. Alternatively, the capacitance-sensing device may have other configurations, such as, for example, the two embodiments illustrated in FIGS. 4B and 4C.

Figure 4B:
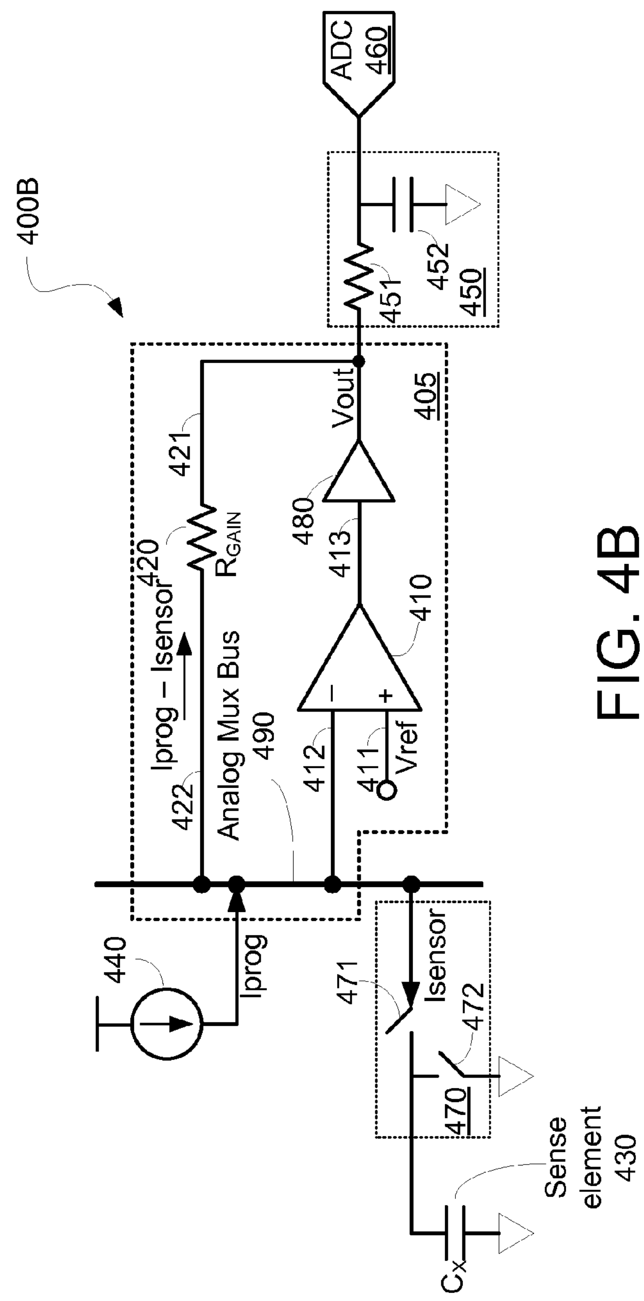
FIG. 4B illustrates another embodiment of capacitance-sensing circuitry of the processing device of FIG. 3.

FIG. 4B illustrates one embodiment of capacitance-sensing circuitry 400B of the processing device 210 of FIG. 3. The capacitance-sensing circuitry 400B includes a transimpedance amplifier 405, a programmable current source 440, a low pass filter 450, an ADC 460, and a switch system 470. The transimpedance amplifier 405 includes an operational amplifier 410 having a negative feedback through a gain resistor $R_{GAIN}$ 420. The operational amplifier 410 includes a positive input 411, a negative input 412, and an output 413. The positive input 411 of the operational amplifier is coupled to a reference voltage source Vref. As a result, the voltage at the negative input 412 of the operational amplifier 410 will be maintained to an approximately constant voltage equal to the reference voltage source Vref, due to the negative feedback of the operational amplifier 410. It should be noted that since the operational amplifier 410 is configured for gain, the positive input 411 and negative input 412 cannot be exactly identical, as determined by the open loop gain of the operational amplifier 410. In one embodiment, an input of an output buffer 480 is coupled to the output 413 of the operational amplifier 410, and an output of the output buffer 480 is coupled to the terminal 421 of the gain resistor $R_{GAIN}$ 420 and the input of the low pass filter 450. The output buffer 480 can be used to drive the output provided to the terminal 421. Alternatively, the output of the operational amplifier 410 is coupled directly to the terminal 421 of the gain resistor $R_{GAIN}$ 420 and the input of the low pass filter 450. The operational amplifier 410 can be made to have sufficient drive to not need the buffer 480. It should also be noted that although only one sense element 430 is depicted in FIG. 4B, the capacitance-sensing circuitry 400B can be configured to measure the capacitance on multiple sense elements. In these embodiments, the switch system 470 would include switches to switch each of the sense elements between ground and the analog mux bus 490.

In another embodiment, the gain resistor $R_{GAIN}$ 420 is replaced with another switching cap (using the same switch phases and timing as switch system 470). Another potential improvement (to reduce the time to a sample through the low-pass filter 450) would be to include a synchronous peak detector replacing filter block 450.

In one embodiment, an analog mux bus 490 is used to couple the negative input 412 of the operational amplifier 410, the terminal 422 of the gain resistor $R_{GAIN}$ 420, the programmable current source 440, and the switch system 470 together. In the depicted embodiment, the analog mux bus 490 is graphically illustrated as a linear bus. As would be appreciated by one of ordinary skill in the art having the benefit of this disclosure, the analog mux bus 490 may be physically implemented in other manners within a processing device, for example linear, rectangular, or circular. From a functional standpoint, the analog mux bus 490 segments the TIA function from the remainder of the sense path. It should also be noted that although FIG. 4B illustrates one sense element 430, in other embodiments, the analog mux bus 490 can have multiple connections to multiple external sense elements 430, each having switches to ground and to the analog mux bus 490. The transimpedance amplifier 405 has dual functions of maintaining a constant voltage on the analog mux bus 490 and converting changes in the sensor current ($I_{sensor}$) due to the changes in sense element capacitance when a touch object is in contact or close proximity to the top surface of the sense element 430 into changes in voltage to be measured by the ADC 460. The sense element 430 is coupled to the negative input 412 of the operational amplifier 410 via the switch system 470 by the analog mux bus 490. The analog mux bus 490 can be used to sense different sense elements by connecting one sense element after the other with the capacitance-sensing circuitry in 400B. Because the analog mux bus 490 is coupled with the negative input 412 of the operational amplifier 410, the analog mux bus 490 is maintained at a constant voltage Vref.

The switch system 470 is configured to connect and disconnect the sense element 430 to the capacitance-sensing circuitry 400B, as well as to connect and disconnect the sense element 430 to ground. The capacitance-sensing circuitry 400B has a pair of switches 471 and 472, which charge and discharge the sense element 430, thereby creating a current flow from the analog mux bus 490. This current flow is then converted to voltage and measured. When measuring the sense element 430, the sense element 430 is charged by the operational amplifier 410 via the gain resistor $R_{GAIN}$ 420 and analog mux bus 490. As described above, the negative feedback through $R_{GAIN}$ 420 allows the operational amplifier 410 to keep the analog mux bus 490 at the reference voltage (Vref), thus, the sense element 430 is charged by drawing current from the operational amplifier 410 through the gain resistor $R_{GAIN}$ 420 and analog mux bus 490. Subsequently, the sense element 430 is discharged, for example, using the switch system 470 to connect the sense element 430 to ground or some other voltage potential. In one embodiment, the switch system 470 includes a charge switch 471 and a discharge switch 472. In one embodiment, the charge switch 471 and the discharge switch 472 open and close alternately at a switch frequency Fs. When the charge switch 471 is open, the discharge switch 472 is closed, and vice versa. Alternatively, the charge switch 471 and discharge switch 472 can be opened and closed at different times, thus creating a deadband state, for example. In one embodiment, the charge switch 471 and the discharge switch 472 are controlled by a switch clock (not shown) having the switch frequency Fs. The charge switch 471 is configured to charge the sense element 430 when the charge switch 471 is closed and the discharge switch 472 is open. The discharge switch 472 is configured to discharge the sense element when the discharge switch 472 is closed and the charge switch 471 is open. In another embodiment, the capacitance-sensing circuitry 400B can be used to measure capacitance on multiple sense elements by having multiple sets of switches 470, one set per external sense element. For example, the multiple sets of switches can be operated sequentially, with those sense elements not currently being measured connected to ground through the discharge switch 472.

Because of the switch system 470, the sense element 430 is switched between the analog mux bus 490 (which is biased to Vref) and ground. When the charge switch 471 is closed, the negative input 412 of the operational amplifier 410 is connected with a sense element 430, and the sense element 430 is charged to a voltage Vref. When the charge switch 471 is open and the discharge switch 472 is closed, the charge accumulated in the sense element 430 (Cx) is transferred or discharged to the ground. The periodic charge and discharge of the sense element 430, due to the voltage differences between Vref and ground, results in an average outward sensor current ($I_{sensor}$) from the analog mux bus 490 to the sense element 430, as represented in the following equation:

$$I_{sensor}=(Vref-Vss)Cx*Fs$$

The current ($I_{sensor}$) represents the capacitance (Cx) of the sense element 430 being measured. The capacitance Cx should be the sum of $C_F$ and $C_P$. It should be noted that the capacitance-sensing circuitry 400B only measures the total capacitance of the sense element, and the total capacitance has these two elements. The capacitance-sensing circuitry 400B can measure the parasitic capacitance $C_P$ as a baseline for an untouched state, and the delta between the untouched and touched states is the part caused by the finger presence ($C_F$). In another embodiment, this same circuit can also be described in the form of a non-inverting amplifier instead of as a TIA. In a non-inverting amplifier, the operational amplifier negative input is connected to ground through an R1 resistor, and the output of the operational amplifier is connected to the negative input through a feedback resistor R2, with the positive input connected to an input voltage (Vref in this case). The Vout of this amplifier is determined by ((R1+R2)/R1)*Vref. Since the switching cap is equivalent to a resistor, it forms the R1 in this circuit.

Vref is the reference voltage applied to the positive input 411 of the operational amplifier 410, Vss is a ground reference voltage, Cx is the capacitance of the sense element 430 (sum of $C_F$ and $C_P$), and Fs is the switch frequency of the switch system 470. In one embodiment, the ground reference voltage Vss=0.

Because the negative feedback of the operational amplifier 410 is connected with the sense element 430 via the analog mux bus 490, the sensor current ($I_{sensor}$) flows through the negative feedback path via the gain resistor $R_{GAIN}$ 420 to form a voltage drop across the $R_{GAIN}$ 420. In one embodiment, the gain resistor $R_{GAIN}$=220 kΩ. Alternatively, other resistive values may be used as would be appreciated by one of ordinary skill in the art having the benefit of this disclosure. The output voltage at the output 413 of the operational amplifier 410 Vout may be computed using the following equation:

$$Vout=(Vref+R_{GAIN}*I_{sensor})=Vref+R_{GAIN}*Vref*Cx*Fs$$

In one embodiment, the programmable current source 440 generates a programmable current ($I_{prog}$) that is used to offset a current drawn by the parasitic capacitance ($C_P$) of the sense element 430 so that only net sensor current change ($I_{prog}-I_{sensor}$) or ($I_{prog}$−Vref*Cx*Fs) will flow through the gain resistor $R_{GAIN}$ 420. When the finger is present on the sense element, the current drawn by sense element also changes which leads to a change in voltage and finally the digital value. In order to use the entire digital range of the ADC 460 to measure the change, only the difference of the current flows through $R_{GAIN}$ 420. In one embodiment, the programmable current ($I_{prog}$) is adjusted such that $I_{prog}$=Vref*Cx*Fs, where Cx is the capacitance of the sense element 430 when no touch object is in contact or close proximity to the top surface of the sense element 430. In an alternate embodiment this programmable current source 440 may be replaced by a variable, programmable, or fixed resistor of appropriate size. Since the mux bus 490 is set to a fixed voltage by the negative feedback from the operational amplifier, the current through this resistor will also be a constant determined by the size of the resistor and the voltage difference between the supply voltage and the mux bus 490 voltage. When a touch object is in contact or close proximity to the top surface of a sense element, the capacitance Cx of the sense element increases to $C_P+C_F$, which results in a more positive voltage at the output 413 of the operational amplifier 410 due to increased current flow through the gain resistor $R_{GAIN}$ 420. Thus, the net sensor current change is equal to Vref*$C_F$*Fs, which is measured by the current capacitance-sensing circuitry 400B to calculate the change in capacitance. Accordingly, $$Vout=Vref(1-R_{GAIN}(I_{prog}-Cx*Fs))$$

Because the capacitance changes of the sense element can be measured by the voltage drop across the gain resistor $R_{GAIN}$ 420, high signal-to-noise ratio (SNR) may be achieved by adjusting gain resistor $R_{GAIN}$ 420 and the programmable current source (IDAC) values to amplify the change in the current drawn by the sense element. The gain resistor $R_{GAIN}$ 420 can be adjusted to tune the response magnitude so that the finger response will cover the entire ADC input voltage range, and the programmable current ($I_{prog}$) can be used to provide a constant offset to counter the current flow due to the fixed parasitic capacitance ($C_P$) of the sense element, which helps narrowing down the measurement window of the ADC to only the finger response.

The transimpedance amplifier 405 senses the sensor current ($I_{sensor}$) drawn by the sense element 430 and converts the sensor current ($I_{sensor}$) to an output voltage Vout. The output voltage Vout is then measured by the ADC 460 to be converted into a digital value KVout, where K is a fixed constant. In one embodiment, the ADC 460 is a successive approximation (SAR) ADC. The resolution of capacitance-sensing circuitry 400B is equal to the resolution of the ADC 460. Because the disclosed embodiment results in a finger response that is independent on the baseline, the baseline value can be set to an arbitrary value by adjusting the value of the programmable current source 440 (e.g., IDAC). In one embodiment, the SAR ADC having a speed of 100 ksps can convert and produce a digital value in about 10 μs. Accordingly, each sense element scan can be measured in less than 30 μs after accounting for all overheads. In another embodiment, the total time for each measurement may be less than 50 μs. Since the time taken for each measurement is reduced, the capacitance-sensing device can be put to sleep between scans for a significant amount of time to preserve power, which can lead to a lower average power consumption. Furthermore, faster scans also make the implementation of various noise filters possible. The disclosed embodiments can measure the absolute capacitance after calibration of the sense elements and can be used with thick overlays and for proximity applications due to high SNR. Alternatively, other types of ADCs may be used as would be appreciated by one of ordinary skill in the art having the benefit of this disclosure.

The low pass filter 450, comprising a resistor 451 and a capacitor 452, is used to remove the ripple of the output voltage Vout generated by the transimpedance amplifier 405. The ripple may be caused due to the switching of the sense element used to create $I_{sensor}$. For example, due to the charging and discharging, a ripple is formed as the current in the analog mux bus 490 flows and then stops repeatedly. While the sense element is charging the current flows from the analog mux bus, but when it is discharging the charge present in the sense element 430 flows to ground and the current flow from the analog mux bus 490 to the sense element 430 is stopped. This creates a ripple in the current, and consequently in the voltage. In one embodiment, the resistor 451 is 680 ohms and the capacitor 452 is 4.7 nF. Alternatively, the resistor 451 may have other values as would be appreciated by one of ordinary skill in the art having the benefit of this disclosure.

Figure 4C:
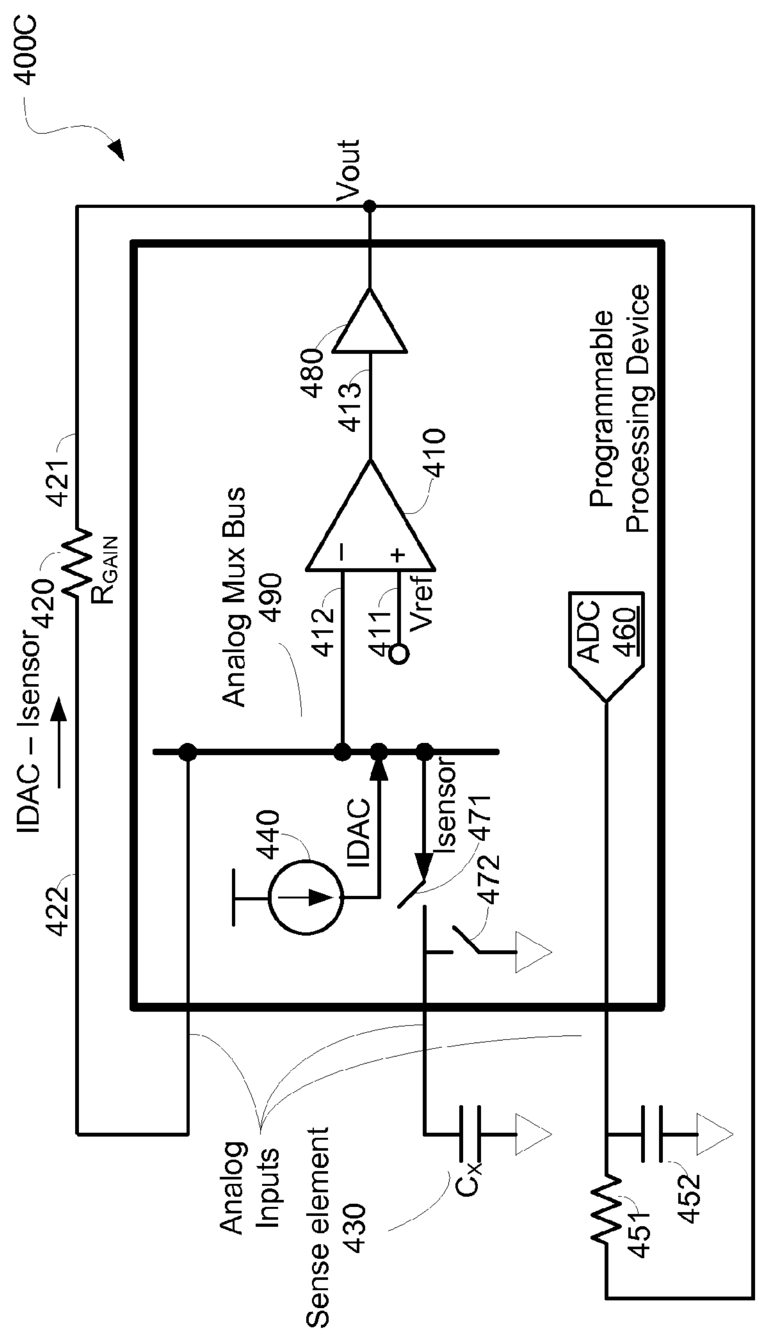
FIG. 4C illustrates another embodiment of capacitance-sensing circuitry of the processing device of FIG. 3.

FIG. 4C illustrates one embodiment of a capacitance-sensing device within a programmable processing device. As shown, the operational amplifier 410, the programmable current source 440, the ADC 460, the switch system 470, the analog mux bus 490, and the output buffer 480 are disposed inside the programmable processing device 400C.

Figure 5:
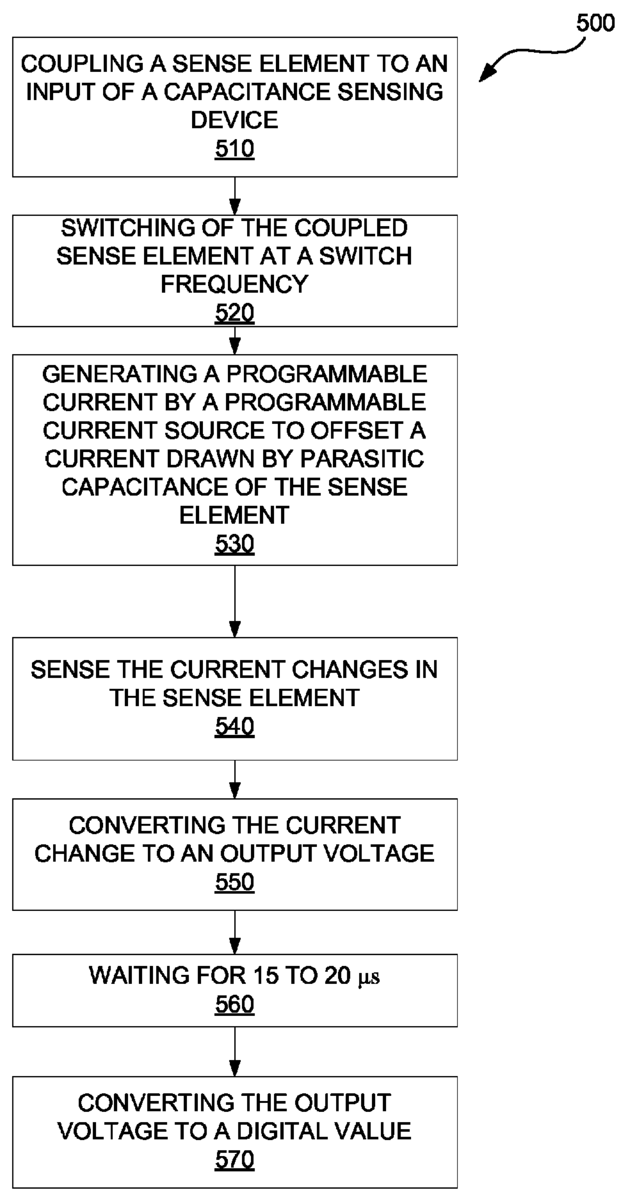
FIG. 5 is a flowchart illustrating one embodiment of a capacitance-sensing method.

FIG. 5 is a flowchart illustrating one embodiment of a capacitance-sensing method. The order in which some or all of the process blocks appear in method 500 should not be deemed limiting. Rather, one or ordinary skill in the art having the benefit of the present disclosure will understand that some of the process blocks may be executed in a variety of orders not illustrated, including executing some of the process steps in parallel.

In block 510, a capacitive sense element to be measured is coupled to an input of a capacitance-sensing device comprising a current-to-voltage converter and an ADC. In one embodiment, the current-to-voltage converter is a transimpedance amplifier comprising an operational amplifier having a negative feedback through a gain resistor $R_{GAIN}$ (e.g., 420). Thus, the sense element is coupled to a negative input of the operational amplifier. The transimpedance amplifier is configured to convert the sensor current ($I_{sensor}$) sensed from the sense element to an output voltage. The transimpedance amplifier is further configured to maintain a constant voltage at the negative input of the operational amplifier, where the constant voltage is equal to a reference voltage applied to a positive input of the operational amplifier of the transimpedance amplifier.

In block 520, the sense element is switched at a switch frequency by a switch system such that the sense element is either connected to (charging) or disconnected from the negative input of the operational amplifier of the transimpedance amplifier at the switch frequency alternately. In a disconnected state from the amplifier, the sense element is connected to ground to drain the charge. In one embodiment, the switch frequency is generated by a switch clock. When the sense element is connected to the negative input of the operational amplifier, the sense element is charged with a charge current sourced from the capacitance-sensing device. When the sense element is disconnected from the negative input of the operational amplifier, the sense element is switched to ground and discharged. In one embodiment, the sense element is coupled to the capacitance-sensing device and the ground via a charge switch and a discharge switch, respectively. When the charge switch is closed, the discharge switch is open, and vice versa.

In block 530, a programmable current is generated by a programmable current source (e.g., IDAC) to offset a current drawn by the parasitic capacitance ($C_P$) of the capacitive sense element. In one embodiment, the programmable current source is programmed by writing a specified value into a register associated with the programmable current source, such as an IDAC control register, in order to generate the programmable current. In one embodiment, the programmable current source is coupled to the negative input of the operational amplifier and the sense element via an analog mux bus.

In block 540, the current-to-voltage converter of the capacitance-sensing device senses the current changes of the sense element and converts the sensed current changes to an output voltage in block 550.

After waiting for 15 to 20 μs in block 560, the ADC of the capacitance-sensing device is triggered so that the ADC will convert the output voltage generated by the current-to-voltage converter to a digital value in block 570. The wait time may be used to stabilize the voltage between the low pass filter 450 and the ADC 460. After the sense element has started switching, it takes some time for the voltage to stabilize in the low pass filter 460. Depending on the presence of a finger, in some cases the voltage will increase while in others it will decrease (e.g., if the last sense element measured had a touch present, and the currently measured sense element does not). In one embodiment, different IDAC settings can be used for different sense elements according to the amount of current to be compensated for each sense element. In one embodiment, the baseline compensation is tuned manually by changing the IDAC values by trial and error. Alternatively, other techniques may be used to determine the IDAC values.

It should be noted that the majority of alternate methods of measuring capacitance make use of charge/time-based sensing methods, where the specific amount of charge delivered into a capacitor to be measured is converted into specific quanta of charge packets or some reference amount of time. Common examples known to those skilled in the art would be charge transfer, relaxation oscillator, and sigma delta conversion methods. With the embodiments described herein, the direct conversion of current into a measurable form allows near instantaneous conversion of a capacitance into a voltage. Within such a conversion, the value of the capacitor being measured is fully represented in each cycle of the switching network. Such direct conversion allows for very fast measurements of capacitance, and allows multiple measurements in a short period of time. These multiple measured values may allow higher level digital filtering; e.g., FIR, IIR, median, and averaging, while not introducing significant latency between the measurement system and processed results.

Figure 6:
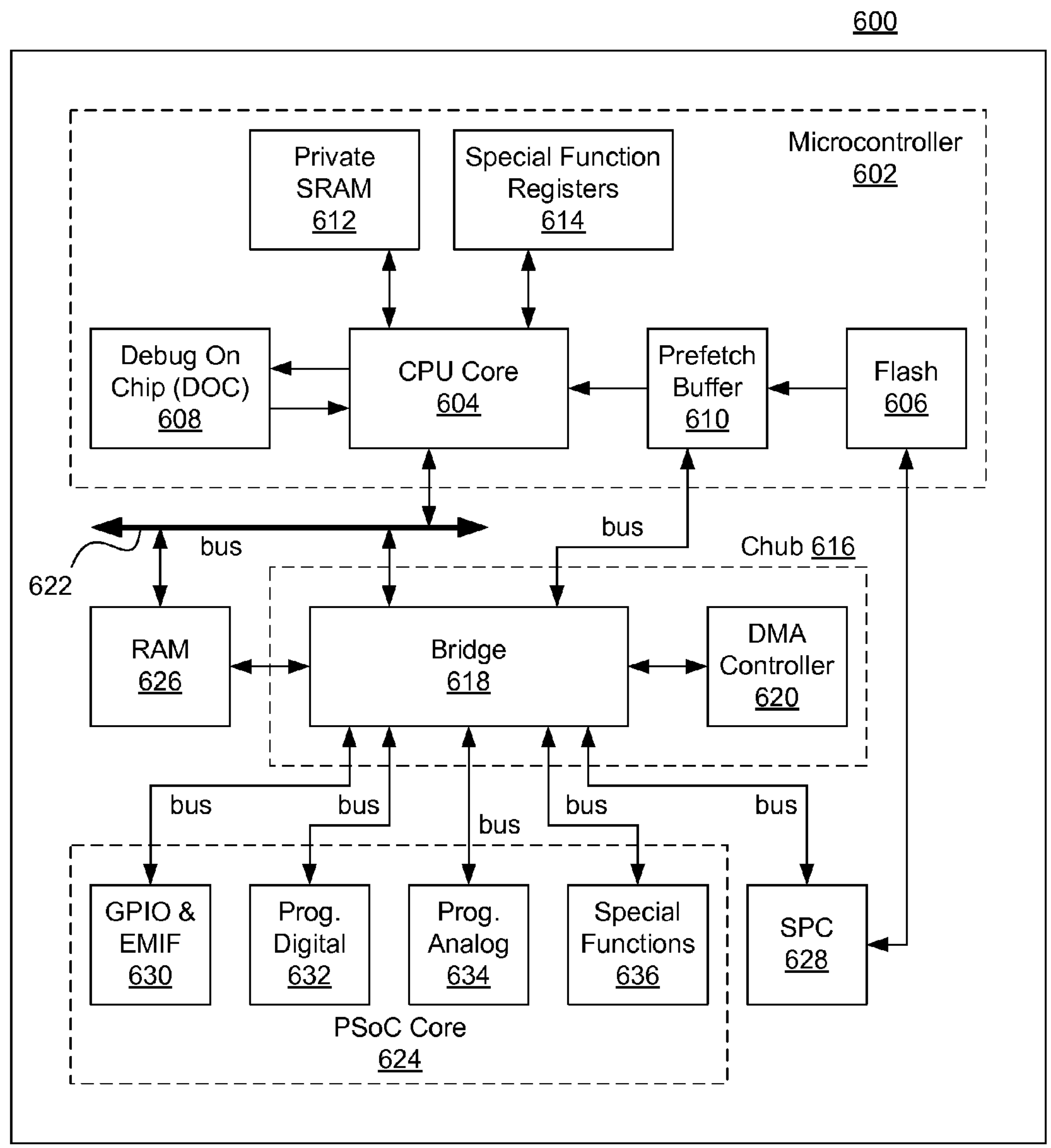
FIG. 6 illustrates an embodiment of a core architecture of the Programmable System-on-Chip (PSoC®) processing device.

FIG. 6 illustrates an embodiment of a core architecture 600 of the PSoC® processing device, such as that used in the PSoC3® family of products offered by Cypress Semiconductor Corporation (San Jose, Calif.). In one embodiment, the core architecture 600 includes a microcontroller 602. The microcontroller 602 includes a CPU (central processing unit) core 604, flash program storage 606, DOC (debug on chip) 608, a prefetch buffer 610, a private SRAM (static random access memory) 612, and special functions registers 614. In an embodiment, the DOC 608, prefetch buffer 610, private SRAM 612, and special function registers 614 are coupled to the CPU core 604, while the flash program storage 606 is coupled to the prefetch buffer 610.

The core architecture 600 may also include a Chub (core hub) 616, including a bridge 618 and a DMA controller (e.g., DMA controller 620), that is coupled to the microcontroller 602 via bus 622. The Chub 616 may provide the primary data and control interface between the microcontroller 602 and its peripherals and memory, and a programmable core 624. The DMA controller 620 may be programmed to transfer data between system elements without burdening the CPU core 604. In various embodiments, each of these subcomponents of the microcontroller 602 and Chub 616 may be different with each choice or type of CPU core 604. The Chub 616 may also be coupled to shared SRAM 626 and an SPC (system performance controller) 628. The private SRAM 612 is independent of the shared SRAM 626 that is accessed by the microcontroller 602 through the bus 622. The CPU core 604 accesses the private SRAM 612 without going through the bridge 618, thus allowing local register and RAM accesses to occur simultaneously with DMA access to shared SRAM 626. Although labeled here as SRAM, these memory modules may be any suitable type of a wide variety of (volatile or non-volatile) memory or data storage modules in various other embodiments.

In various embodiments, the programmable core 624 may include various combinations of subcomponents (not shown), including, but not limited to, a digital logic array, digital peripherals, analog processing channels, global routing analog peripherals, DMA controller(s), SRAM and other appropriate types of data storage, IO ports, and other suitable types of subcomponents. In one embodiment, the programmable core 624 includes a GPIO (general purpose IO) and EMIF (extended memory interface) block 630 to provide a mechanism to extend the external off-chip access of the microcontroller 602, a programmable digital block 632, a programmable analog block 634, and a special functions block 636, each configurable to implement one or more of the subcomponent functions. In various embodiments, the special functions block 636 may include dedicated (non-programmable) functional blocks and/or include one or more interfaces to dedicated functional blocks, such as USB, a crystal oscillator drive, JTAG, and the like.

The programmable digital block 632 may include a digital logic array including an array of digital logic blocks and associated routing. In one embodiment, the digital block architecture is comprised of UDBs (universal digital blocks). For example, each UDB may include an ALU together with CPLD functionality.

In various embodiments, one or more UDBs of the programmable digital block 632 may be configured to perform various digital functions, including, but not limited to, one or more of the following functions: a basic I2C slave; an I2C master; a SPI master or slave; a multi-wire (e.g., 3-wire) SPI master or slave (e.g., MISO/MOSI multiplexed on a single pin); timers and counters (e.g., a pair of 8-bit timers or counters, one 16-bit timer or counter, or one 8-bit capture timer); PWMs (e.g., a pair of 8-bit PWMs, one 16-bit PWM, or one 8-bit deadband PWM), a level sensitive I/O interrupt generator; a quadrature encoder, a UART (e.g., half-duplex); delay lines; and any other suitable type of digital function or combination of digital functions which can be implemented in one or more UDBs.

In other embodiments, additional functions may be implemented using a group of two or more UDBs. Merely for purposes of illustration and not limitation, the following functions can be implemented using multiple UDBs: an I2C slave that supports hardware address detection and the ability to handle a complete transaction without CPU core (e.g., CPU core 604) intervention and to help prevent the forced clock stretching on any bit in the data stream; an I2C multi-master which may include a slave option in a single block; an arbitrary length PRS or CRC (up to 32 bits); a digital correlator (e.g., having up to 32 bits with 4× over-sampling and supporting a configurable threshold); a LINbus interface; a delta-sigma modulator (e.g., for class D audio DAC having a differential output pair); an I2S (stereo); an LCD drive control (e.g., UDBs may be used to implement timing control of the LCD drive blocks and provide display RAM addressing); full-duplex UART (e.g., 7-, 8- or 9-bit with 1 or 2 stop bits and parity, and RTS/CTS support), an IRDA (transmit or receive); capture timer (e.g., 16-bit or the like); deadband PWM (e.g., 16-bit or the like); an SMbus (including formatting of SMbus packets with CRC in software); a brushless motor drive (e.g., to support 6/12 step commutation); auto baud detection and generation (e.g., automatically determine clock frequency for standard signaling rates from 1200 to 115200 baud and after detection to generate required clock to send and receive serial data); and any other suitable type of digital function or combination of digital functions which can be implemented in a plurality of UDBs.

The programmable analog block 634 may include analog resources including, but not limited to, comparators, mixers, PGAs (programmable gain amplifiers), TIAs (trans-impedance amplifiers), ADCs (analog-to-digital converters), DACs (digital-to-analog converters), voltage references, current sources, sample and hold circuits, and any other suitable type of analog resources. The programmable analog block 134 may support various analog functions including, but not limited to, analog routing, LCD drive IO support, capacitance-sensing, voltage measurement, motor control, current to voltage conversion, voltage to frequency conversion, differential amplification, light measurement, inductive position monitoring, filtering, voice coil driving, magnetic card reading, acoustic doppler measurement, echo-ranging, modem transmission and receive encoding, or any other suitable type of analog function.

Embodiments, described herein, include various operations. These operations may be performed by hardware components, software, firmware, or a combination thereof. Any of the signals provided over various buses described herein may be time multiplexed with other signals and provided over one or more common buses. Additionally, the interconnection between circuit components or blocks may be shown as buses or as single signal lines. Each of the buses may alternatively be one or more signal lines and each of the signal lines may alternatively be buses.

Certain embodiments may be implemented as a computer program product that may include instructions stored on a computer-readable storage medium. These instructions may be used to program a general-purpose or special-purpose processor to perform the described operations. The computer-readable storage medium may include, but is not limited to, magnetic storage medium; optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions. The term “computer-readable storage medium” should be taken to include a single medium or multiple media (e.g., a centralized or distributed database, and/or associated caches and servers) that store the one or more sets of instructions. The term “computer-readable storage medium” shall also be taken to include any medium that is capable of storing a set of instructions for execution by the machine and that causes the machine to perform any one or more of the methodologies of the present embodiments.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An apparatus, comprising:

a current-to-voltage converter having an input coupled to receive a current representing a capacitance of a sense element, wherein the current-to-voltage converter is configured to convert the current to an output voltage;

a switch system coupled between the sense element and the input of the current-to-voltage converter, wherein the switch system is configured to either connect the sense element to, or disconnect the sense element from, the input of the current-to-voltage converter; and an analog-to-digital converter (ADC) coupled to receive the output voltage of the current-to-voltage converter, wherein the ADC is configured to convert the output voltage to a digital value, and wherein the current-to-voltage converter is configured to maintain an approximately constant voltage at the input of the current-to-voltage converter.

2. The apparatus of claim 1, wherein the current-to-voltage converter is a transimpedance amplifier that comprises an operational amplifier with a negative feedback.

3. The apparatus of claim 2, wherein the input of the current-to-voltage converter is a negative input of the operational amplifier of the transimpedance amplifier.

4. The apparatus of claim 3, further comprising a programmable current source coupled to the negative input of the operational amplifier, wherein the programmable current source is configured to generate a programmable current to offset a current drawn by parasitic capacitance of the sense element.

5. The apparatus of claim 4, wherein the programmable current is approximately equal to the current drawn by the parasitic capacitance of the sense element.

6. The apparatus of claim 4, wherein the programmable current source and the negative input of the operational amplifier are coupled to the sense element via an analog mux bus.

7. The apparatus of claim 2, wherein a reference voltage is coupled to a positive input of the operational amplifier of the transimpedance amplifier.

8. The apparatus of claim 7, wherein the reference voltage is approximately equal to the constant voltage.

9. The apparatus of claim 1, wherein the switch system is configured to connect and disconnect the sense element at a switch frequency.

10. The apparatus of claim 1, further comprising a low pass filter coupled between the current-to-voltage converter and the ADC.

11. A method, comprising:

sensing current changes in a sense element coupled to an input of a capacitance-sensing device;

generating a programmable current to offset a current drawn by a parasitic capacitance of the sense element;

converting the sensed current changes to an output voltage by the capacitance-sensing device; and measuring capacitance changes of the sense element by converting the output voltage to a digital value.

12. The method of claim 11, further comprising maintaining an approximately constant voltage at the input of the capacitance-sensing device.

13. The method of claim 11, wherein the programmable current is programmed to be equal to the current drawn by the parasitic capacitance of the sense element.

14. The method of claim 11, further comprising switching the sense element at a switch frequency.

15. The method of claim 14, wherein switching the sense element at the switch frequency further comprises:

connecting the sense element to the input of the capacitance-sensing device;

charging the sense element;

disconnecting the sense element from the input of the capacitance-sensing device; and discharging the sense element.

16. The method of claim 11, further comprising waiting for 15 to 20 μs after the converting the sensed current changes to the output voltage before said converting the output voltage to the digital value.

17. The method of claim 11, wherein said converting the output voltage to the digital value is performed substantially instantaneously of said sensing and said converting.

* * * * *